(12) United States Patent
Horie et al.

(10) Patent No.: US 7,253,515 B2
(45) Date of Patent: Aug. 7, 2007

(54) SEMICONDUCTOR PACKAGE FEATURING METAL LID MEMBER

(75) Inventors: Masanao Horie, Kanagawa (JP); Shuuichi Kariyazaki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/495,737

(22) Filed: Jul. 31, 2006

(65) Prior Publication Data
US 2007/0045798 A1    Mar. 1, 2007

(30) Foreign Application Priority Data
Aug. 1, 2005    (JP) .............................. 2005-222608

(51) Int. Cl.
*H01L 23/12*    (2006.01)
(52) U.S. Cl. ...................................... 257/704; 257/778
(58) Field of Classification Search ................ 257/704, 257/678, 708
See application file for complete search history.

(56) References Cited

U.S. PATENT DOCUMENTS 5,572,070 A * 11/1996 Ross ........................ 257/713
5,821,161 A * 10/1998 Covell et al. ................ 438/613
5,881,944 A * 3/1999 Edwards et al. ............ 228/56.3
6,292,369 B1 * 9/2001 Daves et al. ................. 361/719

FOREIGN PATENT DOCUMENTS

JP    2000-150695    5/2000
JP    2001-210761    8/2001

* cited by examiner

*Primary Examiner*—Roy Potter
(74) *Attorney, Agent, or Firm*—McGinn IP Law Group, PLLC

(57) ABSTRACT

In a semiconductor package, a semiconductor chip is mounted on a wiring board or package board. A lid member defines a recess for accommodating the semiconductor chip, and is mounted on the package board so that the semiconductor chip is accommodated in the recess of the lid member. A first adhesive layer is formed on the package board so that a peripheral portion of the lid member is adhered on the package board with the first adhesive layer. A second adhesive layer is formed on the semiconductor chip so that a central portion of the lid member is adhered to the semiconductor chip with the second adhesive layer. The following relationship is established:

$$25\ \mu m \leq h-d \leq 300\ \mu m$$

where: "d" is a depth of the recess of the lid member; and "h" is a sum of a thickness of the semiconductor chip and a thickness of the second adhesive layer.

19 Claims, 10 Drawing Sheets

SEMICONDUCTOR PACKAGE FEATURING METAL LID MEMBER

BACKGROUND OF THE INVENTION

1. Field of the Invention

The present invention relates to a semiconductor package including a package board, a semiconductor chip mounted on the package board, and a metal lid member provided on the package board so that the semiconductor chip is sealed with the metal lid member.

2. Description of the Related Art

As disclosed in, for example, JP-2000-150695 A and JP-2001-210761 A, a prior art semiconductor package includes a wiring board or package board, a semiconductor chip mounted on the package board so as to establish electrical connections therebetween, and a metal lid member mounted on the package board so that the semiconductor chip is sealed with the metal lid member to thereby protect the semiconductor chip.

The metal lid member has a top central portion, and a peripheral portion extending the top central portion, to thereby define a recess for accommodating the semiconductor chip. Namely, the mounting of the metal lid member on the package board is carried out so that the semiconductor chip is accommodated in the recess of the metal lid member, and the recess of the metal lid member is closed by the package board. Note that the metal lid member is usually produced from a copper (Cu) plate blank by using a draw forming process.

In the mounting of the metal lid member on the package board, the periphery portion of the metal lid member is adhered on the upper surface of the package board by using a suitable resin adhesive. Also, the top central portion of the metal lid member is adhered to the semiconductor chip by using a silver (Ag) paste exhibiting a high thermal conductivity. Namely, not only can the metal lid member be used as a protector for the semiconductor chip, but the metal lid member also functions as a heat radiator for the semiconductor chip.

SUMMARY OF THE INVENTION

It has now been discovered that the above-mentioned prior art semiconductor package has a problem to be solved as mentioned hereinbelow.

Before the adhesion of the top central portion of the metal lid member to the semiconductor chip can be ensured, the silver (Ag) paste must be applied as a silver paste layer on the semiconductor chip prior to the mounting of the metal lid member on the package board.

Incidentally, when a plurality of metal lid members are produced by the draw forming process, the depth of the recesses of the metal lid members fluctuates. When the depth of the recess is too large, the top central portion of the metal lid member cannot be properly and sufficiently adhered to the semiconductor chip. On the other hand, when the depth of the recess is too small, it is difficult to obtain a large adhesive force between the peripheral portion of the metal lid member and the top surface of the package board by the resin adhesive. Note, these problems are discussed in detail hereinafter.

In accordance with a first aspect of the present invention, there is provided a semiconductor package comprising a package board, a semiconductor chip mounted on the package board, a lid member defining a recess for accommodating the semiconductor chip and mounted on the package board so that the semiconductor chip is accommodated in the recess of the lid member, a first adhesive layer formed on the package board so that a peripheral portion of the lid member is adhered on the package board with the first adhesive layer, and a second adhesive layer formed on the semiconductor chip so that a central portion of the lid member is adhered to the semiconductor chip with the second adhesive layer.

In the first aspect of the present invention, the following relationship is established:

$$25 \mu m \leq h-d \leq 300 \ \mu m$$

Herein: "d" is a depth of the recess of the lid member; and "h" is a sum of a thickness of the semiconductor chip and a thickness of the second adhesive layer.

In accordance with a second aspect of the present invention, there is provided a semiconductor package comprising a package board, a semiconductor chip mounted on the package board, a molded resin enveloper sealing and encapsulating the semiconductor chip, a lid member defining a recess for accommodating the molded resin enveloper and mounted on the package board so that the molded resin enveloper is accommodated in the recess of the lid member, a first adhesive layer formed on the package board so that a peripheral portion of the lid member is adhered on the package board with the first adhesive layer, and a second adhesive layer formed on the molded resin enveloper so that a central portion of the lid member is adhered to the molded resin enveloper with the second adhesive layer.

In the second aspect of the present invention, the following relationship is established:

$$25 \mu m \leq h-d \leq 300 \ \mu m$$

Herein: "d" is a depth of the recess of the lid member; and "h" is a sum of a thickness of the molded resin enveloper and a thickness of the second adhesive layer.

In the first and second aspects of the present invention, preferably, the first adhesive layer is made of a resin-based adhesive which exhibits an elasticity coefficient falling within a range from 1 MPa to 3 GPa.

The semiconductor chip may be formed as a flip-chip type semiconductor chip having a plurality of metal bumps bonded on a top surface thereof, and the mounting of the flip-chip type semiconductor chip is carried out such that the metal bumps are bonded on the package board so as to establish electrical connection therebetween. In this case, a resin seal may be formed to seal the metal bumps between the package board and the flip-chip type semiconductor chip.

The lid member may be formed as a shaped copper plate by a draw forming process.

The peripheral portion of the lid member may include a skirt portion suspended from a peripheral edge of the central portion, and a flange portion extending from the skirt portion. Optionally, the peripheral portion of the lid member may further include a rim portion projecting from an outer peripheral edge of the flange portion.

Also, the peripheral portion of the lid member may be formed as a thickened flange portion suspended from a peripheral edge of the central portion.

Preferably, the first adhesive layer is made of a resin-based adhesive selected from the group consisting of a silicone-based adhesive, and an epoxy-based adhesive. Similarly, the second adhesive layer may be made of the resin-based adhesive, but the second adhesive layer is preferably made of a silver paste exhibiting a high thermal conductivity.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the embodiments of the present invention, for better understanding of the present invention, a prior art semiconductor package, as disclosed in, for example, the above-mentioned JP-2000-150695 A and JP-2001-210761 A, will be explained with reference to FIG. 1.

Figure 1:
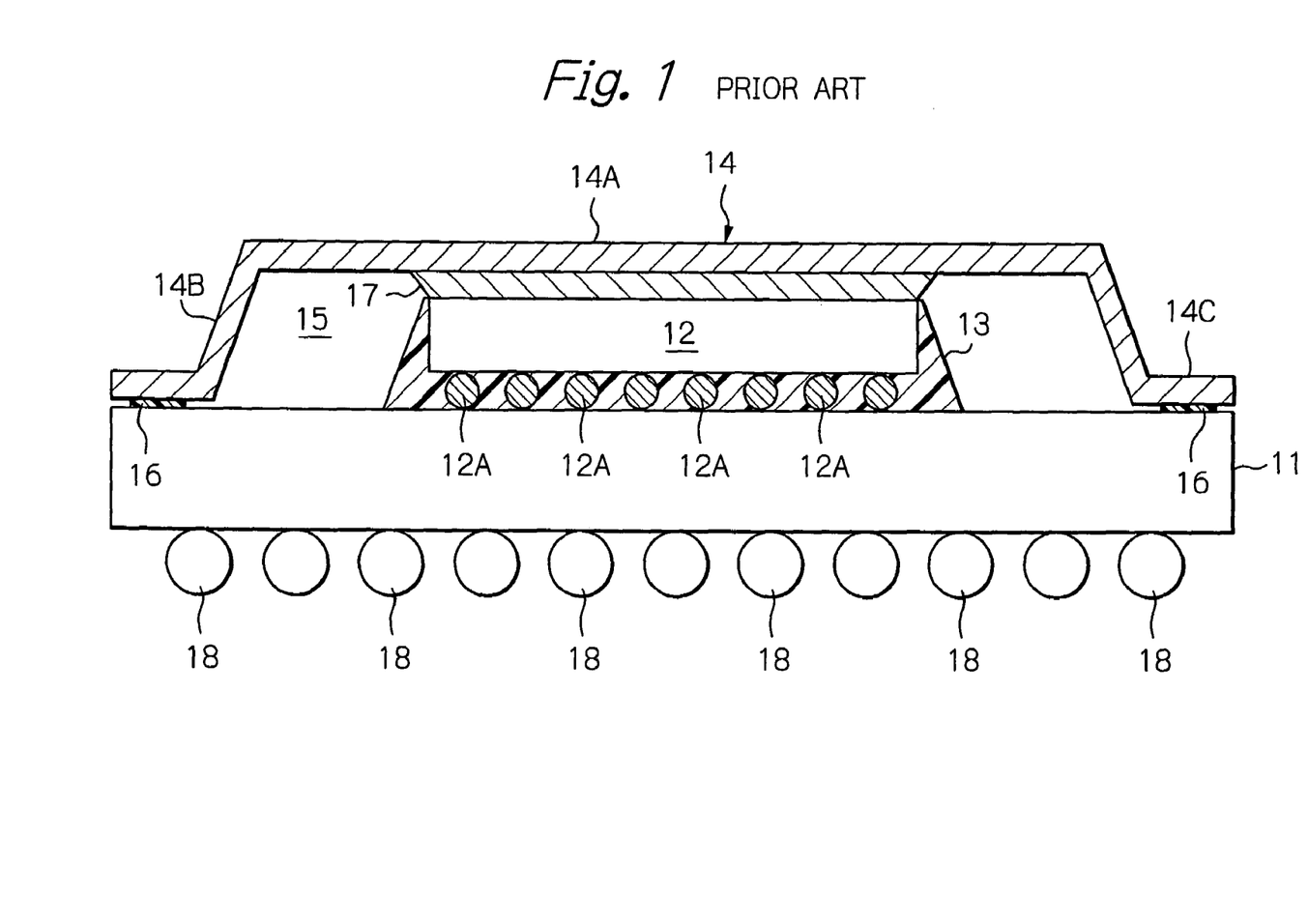
FIG. 1 is a partial cross-sectional view of the prior art semiconductor package.

Referring to FIG. 1 which is a partial cross-sectional view, the prior art semiconductor package includes an interposer or package board 11 which may be made of a suitable insulating material, such as epoxy-based resin, polyimide-based resin, polyamide-based resin, glass epoxy, ceramic or the like. The package board 11 has a top wiring pattern layer (not shown) formed on a top surface thereof, an internal wiring pattern layer (not shown) formed therein, and a plurality of bottom electrode pads (not shown) formed on a bottom surface thereof. The top wiring pattern layer is suitably connected to the internal wiring pattern layer through a plurality of via plugs (not shown) formed in the package board 11, and the internal wiring pattern layer is connected to the bottom electrode pads through a plurality of via plugs (not shown) formed in the package board 11.

Also, the prior art semiconductor package includes a semiconductor chip 12 which is formed as a flip-chip (FC) type semiconductor chip, and which is mounted on the top surface of the package board 11. In particular, the FC type semiconductor chip 12 has a plurality of metal bumps 12A bonded to a top surface thereof. On the other hand, the top wiring layer of the package board 11 has a plurality of electrode pads (not shown) which are arranged so as to have a mirror image relationship with respect to an arrangement of the metal bumps 12A. The FC type semiconductor chip 12 is flipped over and mounted on the top wiring pattern layer of the package board 11 so that the metal bumps 12A are aligned with and bonded to the respective electrode pads thereof.

The bonding of the metal bumps 12A to the electrode pads may be carried out by a reflow process in which the metal bumps 12A are exposed to hot air. Preferably, the metal bumps 12A are made of a lead-free solder, such as eutectic solder, high-temperature solder, tin/silver alloy based solder or the like.

The prior art semiconductor package further includes a resin seal 13 which is filled in a space between the top surface of the package board 11 and the top surface of the FC type semiconductor chip 12, with the side faces of the FC type semiconductor chip 12 being covered with the resin seal structure 13. The resin seal structure 13 may be made of a suitable rein material, such as silicone-based resin, epoxy-based resin or the like, and it is possible to carry out the formation of the resin seal structure 13 by using, for example, a resin underfilling process.

In short, the FC type semiconductor chip 12 is securely fixed on the package board 11 with the resin seal structure 13, and thus the metal bumps 12A can be prevented from being damaged and cracked when the semiconductor package is subjected to thermal stresses due to temperature variation.

Also, recently, a low-k (e.g. SiOCH) layer exhibiting a smaller dielectric constant is used as an insulating layer in a semiconductor chip to meet the demands of higher performance and higher speed, but the low-k layer is susceptible to exfoliation when the semiconductor package is subjected to thermal stresses due to temperature variation. When the FC type semiconductor chip 12 has a low-k layer, it is possible to prevent the exfoliation of the low-k layer due to the resin seal structure 13. Note, the resin seal structure 13 should have a high coefficient of elasticity on the order of 10 GPa, before the exfoliation of the low-k layer can be effectively prevented.

Furthermore, the prior art semiconductor package includes a metal lid member 14 which is provided on the package board 11 so that the FC type semiconductor chip 12 is encapsulated in a sealed space 15 defined therebetween. The metal lid member 14 is produced from a copper (Cu) plate blank by using a draw forming process so as to be shaped as shown in FIG. 1. Namely, the metal lid member 14 includes a top central portion 14A, a skirt portion 14B integrally suspended from a periphery of the top central portion 14A, and a flange portion 14C integrally extended from a periphery edge of the skirt portion 14B in parallel with the top central portion 14A. Note that both the skirt portion 14B and the flange portion 14C define a peripheral portion of the metal lid member 14.

The metal lid member 14 is adhered to the package board 11 at the flange portion 14C with an adhesive layer 16, and is further adhered to a bottom surface of the FC type semiconductor chip 12 with an adhesive layer 17, resulting in the definition of the sealed space 15 for encapsulating the FC type semiconductor chip 12. Namely, the FC type semiconductor chip 12 is protected by the metal lid member 14.

For the adhesive layer 16, it is possible to use a suitable resin adhesive made of substantially the same resin as the resin seal structure 13. That is, the adhesive layer 16 may be made of a suitable resin adhesive, such as a silicone-based resin adhesive, an epoxy-based resin adhesive or the like. On the other hand, for the adhesive layer 17, it is preferable to use a silver (Ag) paste exhibiting a high thermal conductivity, because the metal lid member 14 also functions as a heat radiator for the FC type semiconductor chip 12. Nevertheless, the adhesive layer 17 may be formed from the same resin adhesive as the adhesive layer 16, if necessary.

The prior art semiconductor package is provided with a plurality of metal balls 18 bonded to the respective electrode pads formed on the bottom surface of the package board 11. Each of the metal balls 18 serves as an external electrode terminal, and is made of a suitable metal material, such as gold (Au), copper (Cu), silver/tin alloy (Ag/Sn) or the like. Namely, the semiconductor package is formed as a ball grid array (BGA) type semiconductor package.

In the above-mentioned prior art semiconductor package, when the metal lid member 14 is mounted on the package board 11, first, an uncured resin adhesive is applied on the top surface of the package board 11 for the formation of the adhesive layer 16, and a silver paste is applied on the bottom surface of the FC type semiconductor chip 12 for the formation of the adhesive layer 17. Then, the metal lid member 14 is put in place on the package board 11 so that the top central portion 14A and the flange portion 14C are abutted against the applied silver paste and the applied resin adhesive, respectively. Subsequently, both the applied resin adhesive and the applied silver paste are subjected to a baking process so as to be respectively cured and set, with a pressure being moderately exerted on the metal lid member 14, resulting in the formation of the adhesive layers 16 and 17. Thus, the mounting of the metal lid member 14 on the package board 11 with the adhesive layers 16 and 17 is completed.

Nevertheless, there may be a case where the top central portion 14A of the metal lid member 14 cannot be sufficiently adhered to the bottom surface of the FC type semiconductor chip due to a dimensional fluctuation involved in the production of the metal lid member 14 by the aforesaid draw forming process.

In particular, the metal lid member 14 has a recess defined by the top central portion 14A and the skirt portion 14B to accommodate the FC type semiconductor chip 12 with the paste-like adhesive layer 17, but a depth "D" of the recess fluctuates in the production of metal lid members (14) by the draw forming process.

When the depth "D" of the recess is too large, the top central portion 14A cannot be tightly abutted against the applied silver paste (17) during the mounting of the metal lid member 14 on the package board 11, because the flange portion 14C is prematurely abutted against the uncured resin adhesive (16). As a result, the top central portion 14A cannot be completely adhered to the bottom surface of the FC type semiconductor chip 12 with the adhesive layer 17. At the worst, there may be a case where the top central portion 14A is even spaced apart from the adhesive layer 17. When a sufficient thermal connection is not established between the FC type semiconductor chip 12 and the metal lid member 14, the metal lid member 14 cannot function as a heat radiator.

Although a semiconductor package, in which a sufficient thermal connection is not established between the FC type semiconductor chip 12 and the metal lid member 14, must be excluded as a defective product, it is very difficult and troublesome to inspect whether the top central portion 14A is properly adhered to the bottom surface of the FC type semiconductor chip 12 with the adhesive layer 17, because the adhesion layer 17 cannot be externally observed.

On the other hand, when the depth "D" of the recess is too small, the top central portion 14A of the metal lid member 14 can be properly abutted against the applied silver paste (17), but a space between the top surface of the package board 11 and the flange portion 14C of the metal lid member 14 becomes larger so that it is difficult to obtain a large adhesive force between the top surface of the package board 11 and the flange portion 14C of the metal lid member 14 by the adhesive layer 16.

In particular, in general, the uncured resin adhesive, which is used to form the adhesive layer 16, exhibits a relatively large viscosity. When the uncured resin adhesive is applied as a drop on the top surface of the package board 11, the height of the drop is approximately one third of the bottom diameter of the drop. Thus, for example, for the formation of the resin adhesive layer 16, when the uncured resin adhesive (16) is applied on the top surface of the package board 11 so that the applied resin adhesive has a width of 1.5 mm, the applied resin adhesive has a height of approximately 500 μm (0.5 mm).

In this case, before the space between the top surface of the package board 11 and the flange portion 14C of the metal lid member 14 can be sufficiently filled with the uncured resin adhesive to thereby obtain the large adhesive force therebetween, the space concerned must have a height of at most 300 μm.

First Embodiment

Figure 2:
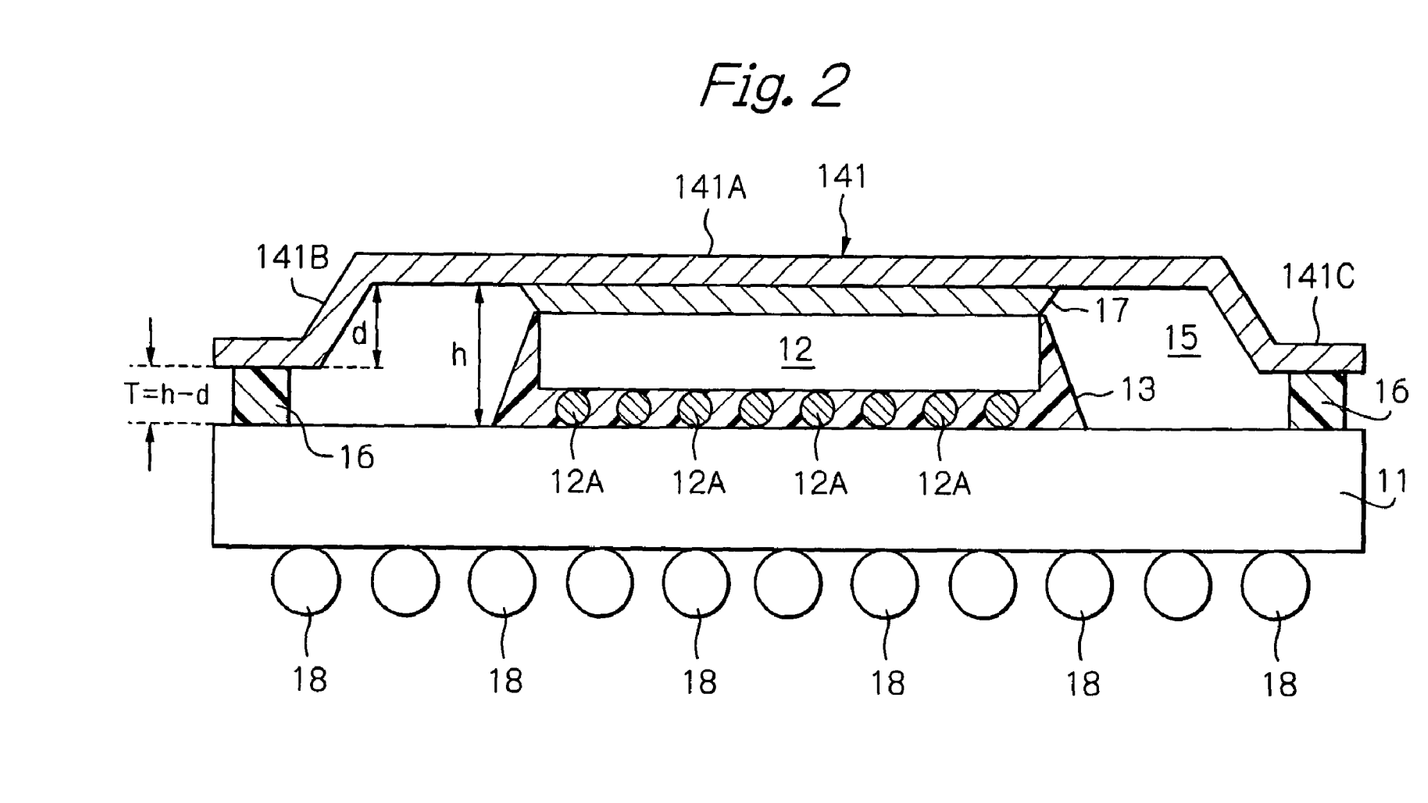
FIG. 2 is a partial cross-sectional view of a first embodiment of the BGA type semiconductor package according to the present invention.

With reference to FIG. 2 which is a partial cross-sectional view, a first embodiment of the BGA type semiconductor package according to the present invention will now be explained.

The BGA type semiconductor package is identical to the prior art BGA type semiconductor package of FIG. 1 except that a metal lid member 141 is substituted for the metal lid member 14 of FIG. 1. Similar to the metal lid member 14, the metal lid member 141 is made of a copper (Cu) plate blank by using a draw forming process so as to be shaped as shown in FIG. 2. Namely, the metal lid member 141 includes a top central portion 141A, a skirt portion 141B integrally suspended from a periphery of the top central portion 141A, and a flange portion 141C integrally extended from a periphery edge of the skirt portion 141B in parallel with the top central portion 141A. Also, the metal lid member 141 has a thickness falling within a range from 0.5 to 1.0 mm.

The copper (Cu) plate blank for producing the metal lid member 141 may be plated with Nickel (Ni). Also, for the copper (Cu) plate blank, it is possible to use another metal plate blank exhibiting similar physical properties to those of copper (Cu).

In FIG. 2, the metal lid member 141 has a depth "d" of a recess which is defined by the top central portion 141A and the skirt portion 141B, and the FC type semiconductor chip 12 with the paste-like adhesive layer 17 has a height "h".

According to the present invention, the metal lid member 141 is relatively featured by the dimensions "d" and "h". Namely, the production of the metal lid member 141 is carried out such that the following relationship is established:

$$25 \mu m \leq h - d \leq 300 \ \mu m$$

When the metal lid member 141 is mounted on the package board 11, a thickness "T" of the resin adhesive layer 16 is defined as follows:

$$T = h - d$$

As already stated above, for the formation of the resin adhesive layer 16, when the uncured resin adhesive (16) is applied on the top surface of the package board 11 so that the applied resin adhesive has the width of 1.5 mm, the applied resin adhesive has the height of approximately 500 μm (0.5 mm). In this case, the space between the top surface of the package board 11 and the flange portion 141C of the metal lid member 141 must have the height of at most 300 μm before the space can be sufficiently filled with the uncured resin adhesive to thereby obtain the large adhesive force therebetween.

Note, in FIG. 2, since the resin adhesive layer 16 is exaggeratedly illustrated, the illustrated dimensions of the resin adhesive layer 16 are utterly inaccurate. Also, note, although the thickness of the adhesive layer 17 is exaggeratedly illustrated, in reality, it is considerably thin in comparison with the thickness of the resin adhesive layer 16.

On the other hand, the space between the top surface of the package board 11 and the flange portion 141C of the metal lid member 141 must have the height of at least 25 μm before the top central portion 141A of the metal lid member 141 can be properly adhered to the adhesive layer 17 to thereby establish a sufficient thermal connection between the FC type semiconductor chip 12 and the metal lid member 141.

In short, in the production of the metal lid member 141, a tolerance from 25 to 300 μm is allowed with respect to the depth "d" of the metal lid member 141. As long as the depth "d" of the metal lid member 141 falls within a tolerance from 25 to 300 μm, not only can the sufficient thermal connection be sufficiently established between the FC type semiconductor chip 12 and the metal lid member 141 by the adhesive layer 17, but also the flange portion 141C of the metal lid member 141 can be properly and firmly adhered to top surface of the package board 11 by the resin adhesive layer 16.

With reference to FIGS. 3A through 3D, a method for manufacturing the above-mentioned BGA type semiconductor package of FIG. 2 is explained below.

Figure 3A:
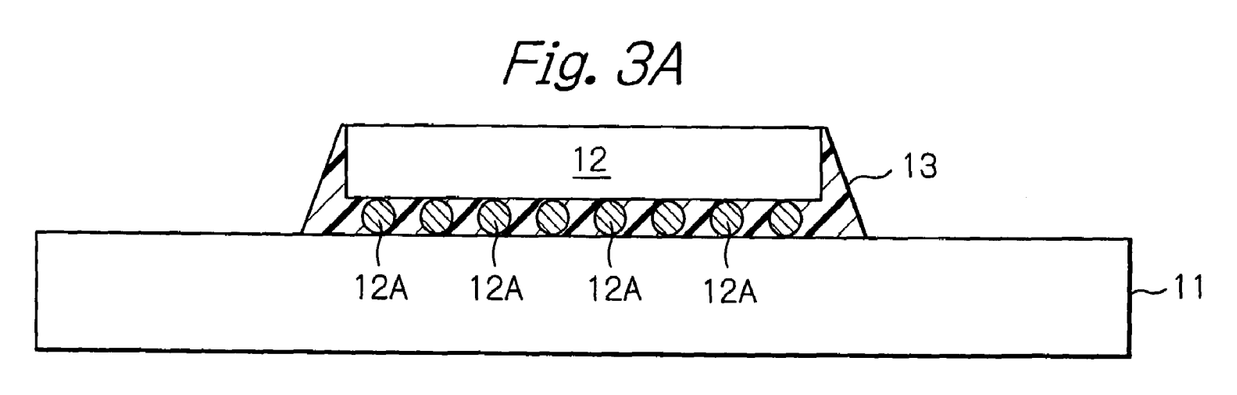
FIGS. 3A through 3D are explanatory views for explaining a method for manufacturing the BGA type semiconductor package of FIG. 2.

First, referring to FIG. 3A which is a partial cross-sectional view, a package board 11 is prepared, and an FC type semiconductor package 12 is flipped over and mounted on the package board 11 so that metal bumps 12A are bonded to the respective electrode pads included in the wiring pattern layer (not shown) formed on the top surface of the package board 11. As already stated with reference to FIG. 1, the bonding of the metal bumps 12A to the electrode pads may be carried out by the reflow process in which the metal bumps 12A are exposed to hot air.

Then, a resin seal structure 13 is formed so as to be filled in the space between the top surface of the package board 11 and the top surface of the FC type semiconductor chip 12, and so as to cover the side faces of the FC type semiconductor chip 12. The resin underfilling process maybe used to carry out the formation of the resin seal structure 13.

Figure 3B:
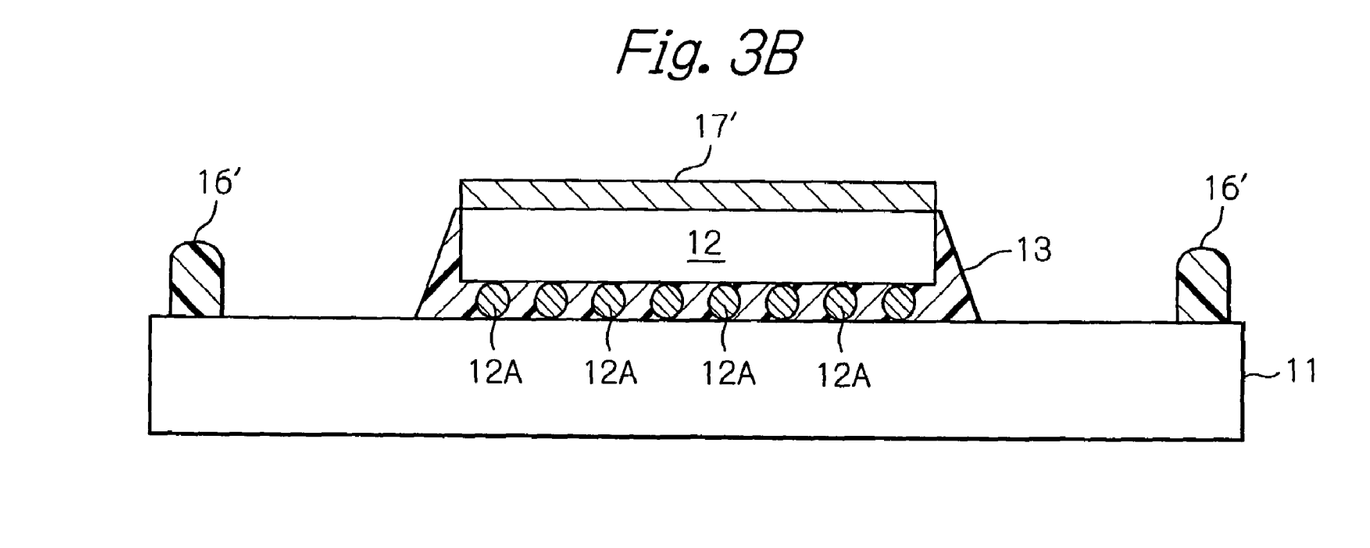

Next, referring to FIG. 3B which is a partial cross-sectional view, an uncured resin adhesive 16' is applied in place on the top surface of the package board 11, and a silver paste 17' is applied on the bottom surface of the FC type semiconductor chip 12.

Figure 3C:
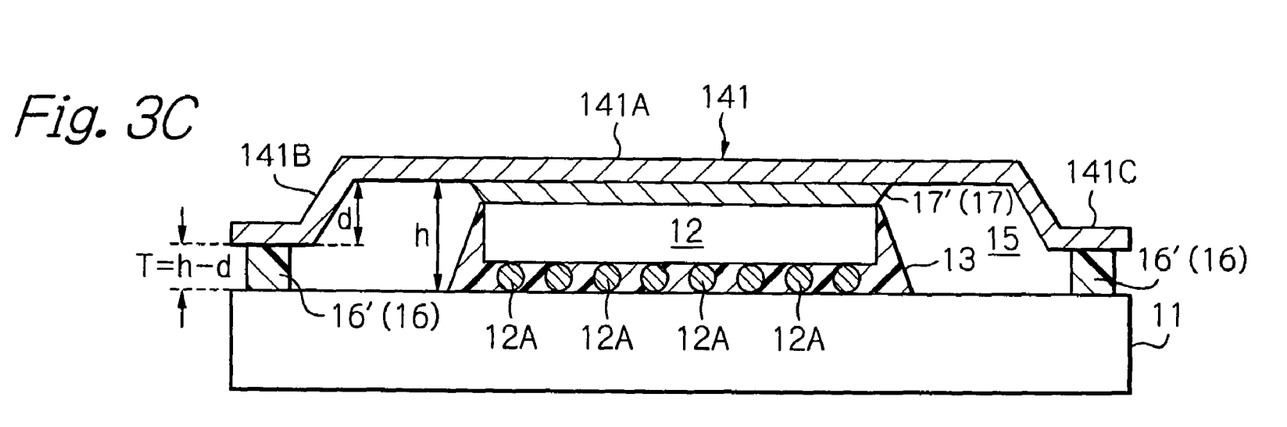

Next, referring to FIG. 3C which is a partial cross-sectional view, a metal lid member 141 is put on the top surface of the package board 11 so that the top central portion 141A and the flange portion 141C of the metal lid member 141 are abutted against the applied silver paste 17' and the applied resin adhesive 16', respectively. Subsequently, both the applied resin adhesive 16' and the applied silver paste 17' are subjected to a baking process so as to be respectively cured and set, with a pressure being moderately exerted on the metal lid member 141, resulting in the formation of adhesive layers 16 and 17. Thus, the mounting of the metal lid member 141 on the package board 11 with the adhesive layers 16 and 17 is completed, and the FC type semiconductor chip 12 is encapsulated in the sealed space 15 defined between the package board 11 and the metal lid member 141.

At this time, when the thickness "T" of the adhesive resin layer 16 falls within the tolerance from 25 to 300 μm, it means that the mounting of the metal lid member 141 on the package board 11 with the adhesive layers 16 and 17 is successfully carried out. On the other hand, if the thickness "T" of the adhesive resin layer 16 is out of the tolerance from 25 to 300 μm, it means that the product concerned is defective. Since the adhesive resin layer 16 can be externally observed, it is possible to very easily carry out a measurement of the thickness "T" of the adhesive resin layer 16. Namely, since it is possible to easily inspect whether the top central portion 141A is properly adhered to the bottom s surface of the FC type semiconductor chip 12 with the adhesive layer 17, the defective products can be excluded at low cost.

Figure 3D:
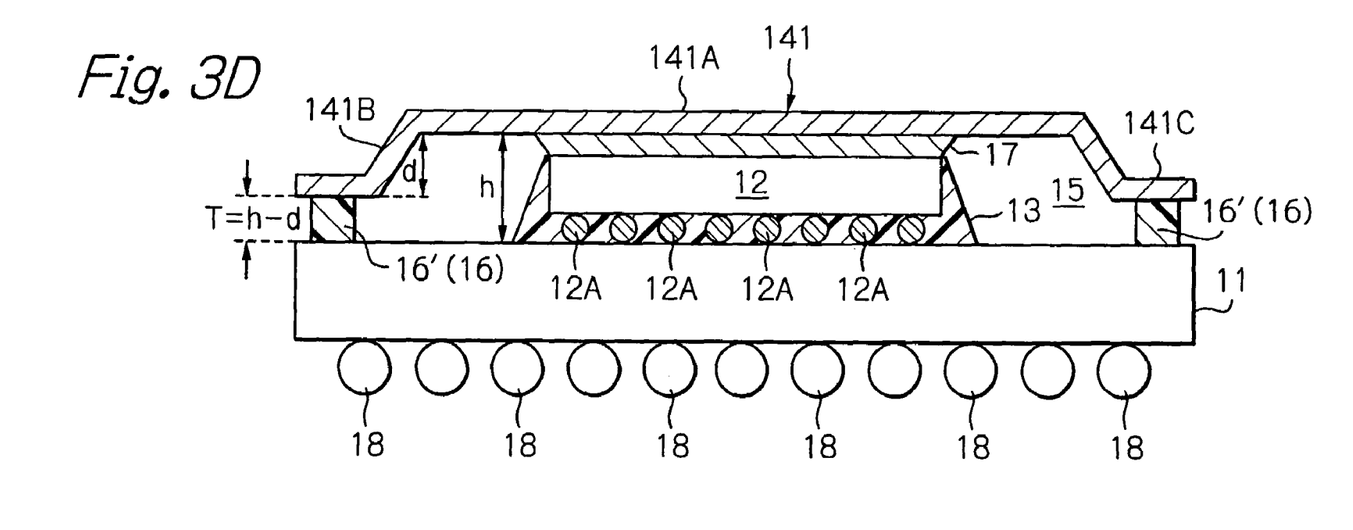

Next, referring to FIG. 3D which is a partial cross-sectional view, metal balls 18 are bonded to the respective electrode pads formed on the bottom surface of the package board 11, resulting in the completion of the production of the BGA type semiconductor package.

Figure 4A:
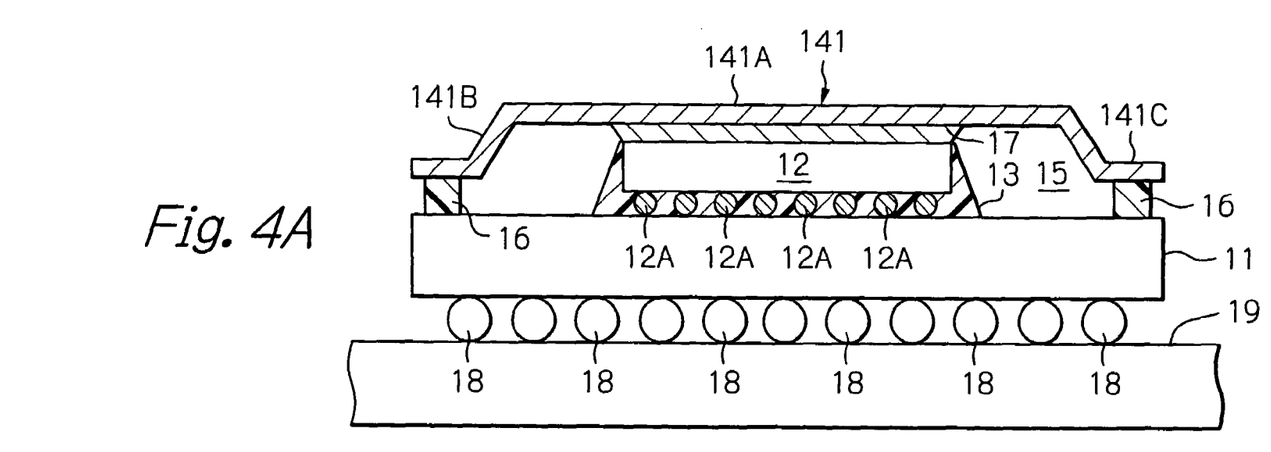
FIG. 4A is a partial cross-sectional view of the BGA type semiconductor package of FIG. 3D, which is mounted on a motherboard.

Referring to FIG. 4A which is a partial cross-sectional view, the BGA type semiconductor package is mounted on a motherboard 19 for a suitable piece of electronic equipment so that the metal balls 18 are bonded on respective electrode pads (not shown) formed on a top surface of the motherboard 19. Since the piece of electronic equipment may be used in various environments in which temperatures are varied, the BGA type semiconductor package is subjected to internal thermal stresses generated in the package board 11 and the metal lid member 141 due to differences of thermal expansion therebetween.

Figure 4B:
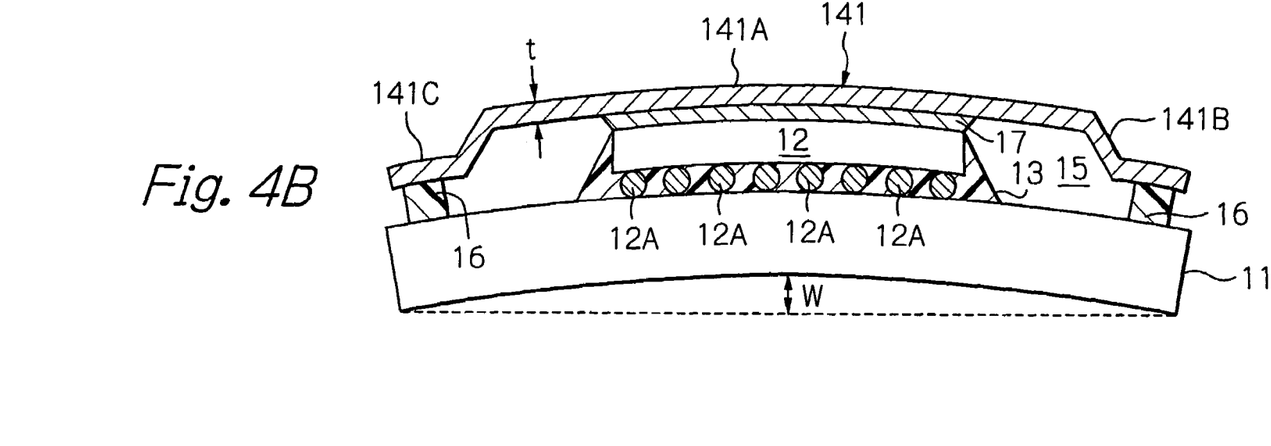
FIG. 4B is a partial cross-sectional view of the BGA type semiconductor package of FIG. 4A, which is warped due to internal thermal stresses.

As exaggeratedly shown in FIG. 4B which is a partial cross-sectional view, when the BGA type semiconductor package is put under a high temperature, it is warped because the thermal expansion of the metal lid member 141 is larger than that of the package board 11. At this time, a shearing stress is generated in the resin adhesive layer 16. Thus, if the resin adhesive layer 16 exhibits a high coefficient of elasticity, the resin adhesive layer 16 might be subjected to damage so that the metal lid member 141 is removed from the package board 11.

Note, in FIG. 4B, a distance "W", represents a magnitude of warp to which the package board 11 is subjected, and the thickness of the metal lid member 141 is represented by reference "t".

The inventors have carried out a first simulation to find how the maximum shearing stress in the resin adhesive layer 16 is varied when the elasticity coefficient of the resin adhesive layer is changed in the temperature range from 0 to 125° C. in four cases (a), (b), (c) and (d). Note, in the case (a), t=0.5 mm, and T=100 μm; in the case (b), t=0.5 mm, and T=300 μm; in the case (c), t=0.5 mm, and T=25 μm; and, in the case (d), t=1.0 mm, and T=100 μm. Also, note that it is presumed that the metal lid member 141 is made of copper (Cu).

Figure 5:
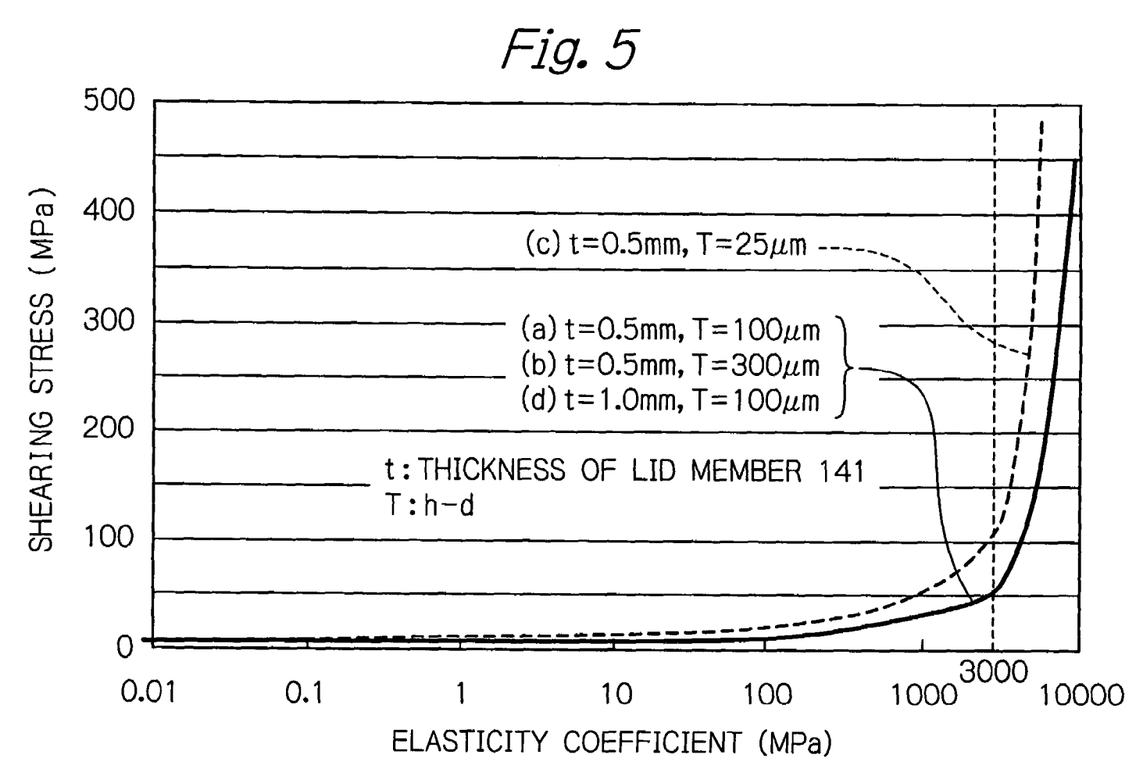
FIG. 5 is a graph showing a characteristic of a resin-based adhesive layer used in the BGA type semiconductor package of FIG. 2.

The results of the first simulation are shown in a graph of FIG. 5.

As shown in the graph of FIG. 5, in all the cases (a), (b), (c) and (d), when the elasticity coefficient of the resin adhesive layer 16 exceeds 3000 MPa (3 GPa), it was found that the shearing stress abruptly ascends. This means that the resin adhesive layer 16 should have a low elasticity coefficient before the resin adhesive layer 16 can be protected from being damaged.

Also, from the results of the cases (a), (b) and (c), it was found that the shearing stress could be considerably reduced when the thickness "T" of the resin adhesive layer 16 falls within the tolerance from 25 to 300 μm and when the elasticity coefficient of the resin adhesive layer 16 is less than 3 GPa. On the other hand, from the results of the cases (a) and (d), it was found that the considerable reduction of the shearing stress could be obtained when the thickness "t" of the metal lid member 141 falls within the range from 0.5 to 1.0 mm.

Thus, in order for the resin adhesive layer 16 to be prevented from being damaged, the resin adhesive layer 16 should have an elasticity coefficient of less than about 3,000 MPa.

Figure 6:
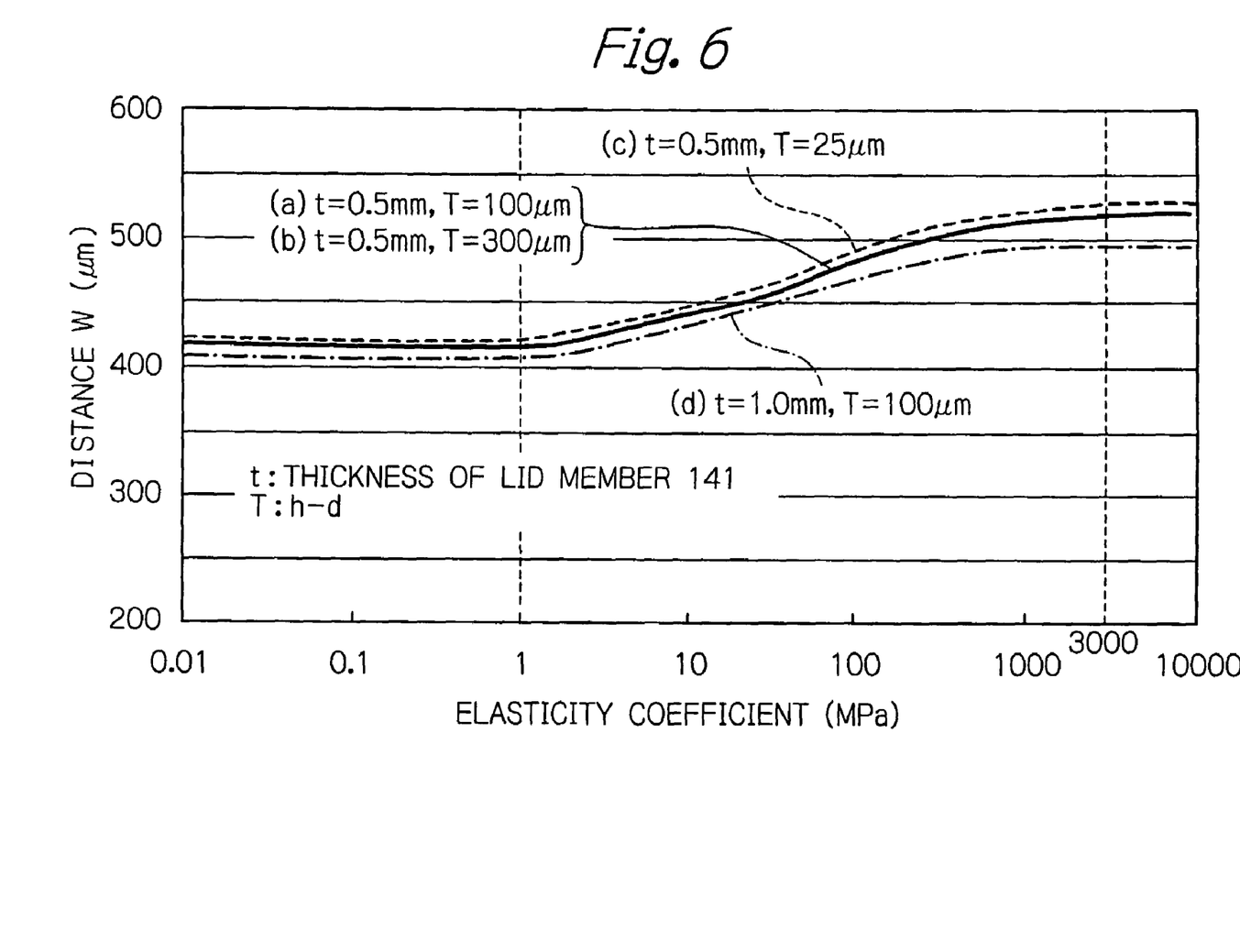
FIG. 6 is a graph showing another characteristic of the resin-based adhesive layer used in the BGA type semiconductor package of FIG. 2.

The inventors further have carried out a second simulation to find how the maximum distance "W" of the package board 11 is varied when the elasticity coefficient of the resin adhesive layer is changed in the temperature range from 0 to 125° C. in the same cases (a), (b), (c) and (d) as mentioned above. Note, similar to the aforesaid first simulation, it is presumed that the metal lid member 141 is made of copper (Cu).

The results of the second simulation are shown in a graph of FIG. 6.

As shown in the graph of FIG. 6, in all the cases (a), (b), (c) and (d), when the elasticity coefficient of the resin adhesive layer 16 is less than 1 MPa (3 GPa), it was found that the distance "W" is invariable at a point somewhat over 420 μm. This means that the metal lid member 141 is not substantially adhered to the package board 11 by the resin adhesive layer 16 when the elasticity coefficient of the resin adhesive layer 16 is less than 1 MPa. Namely, it was found that the movement of the metal lid member 141 could not be substantially restrained due to the fact that the elasticity coefficient of the resin adhesive layer 16 is too small (less than 1 MPa). Also, this characteristic is invariable under either the condition that the thickness "T" of the resin adhesive layer 16 falls within the tolerance from 25 to 300 μm or the condition the thickness "t" of the metal lid member 141 falls in the range from 0.5 to 1.0 mm.

Thus, it was found that the resin adhesive layer 16 having the thickness "T"(25 to 300 μm) should have an elasticity coefficient of more than 1 MPa before the metal lid member 141 having the thickness "t" (0.5 to 1.0 mm) can be effectively adhered on the package board 11 by the resin adhesive layer 16. Note, it was found that the distance "W" is saturated at a definite value when the resin adhesive layer 16 has an elasticity coefficient of more than 3 GPa.

In short, when the thickness "T" of the resin adhesive layer 16 is within the range from 25 to 300 μm, the resin adhesive layer 16 should have an elasticity coefficient falling within the range from 1 MPa to 3 GPa before the flange portion 141C of the metal lid member 141 can be properly adhered on the package board 11 without the resin adhesive layer 16 being subjected to damage.

For the above-mentioned reasons, although it is preferable that the resin adhesive layer 16 has an elasticity coefficient falling within the range from 1 MPa to 3 GPa, the elasticity coefficient of the resin adhesive layer 16 may be out of the range from 1 MPa to 3 GPa, because the fixing of the metal lid member 141 on the package board 11 can be sufficiently ensured due to the firm adhesion of the top central portion 141A to the bottom surface of the FC type semiconductor chip 12 as long as the thickness "T" of the resin adhesive layer 16 is within the range from 25 to 300 μm.

Second Embodiment

Figure 7:
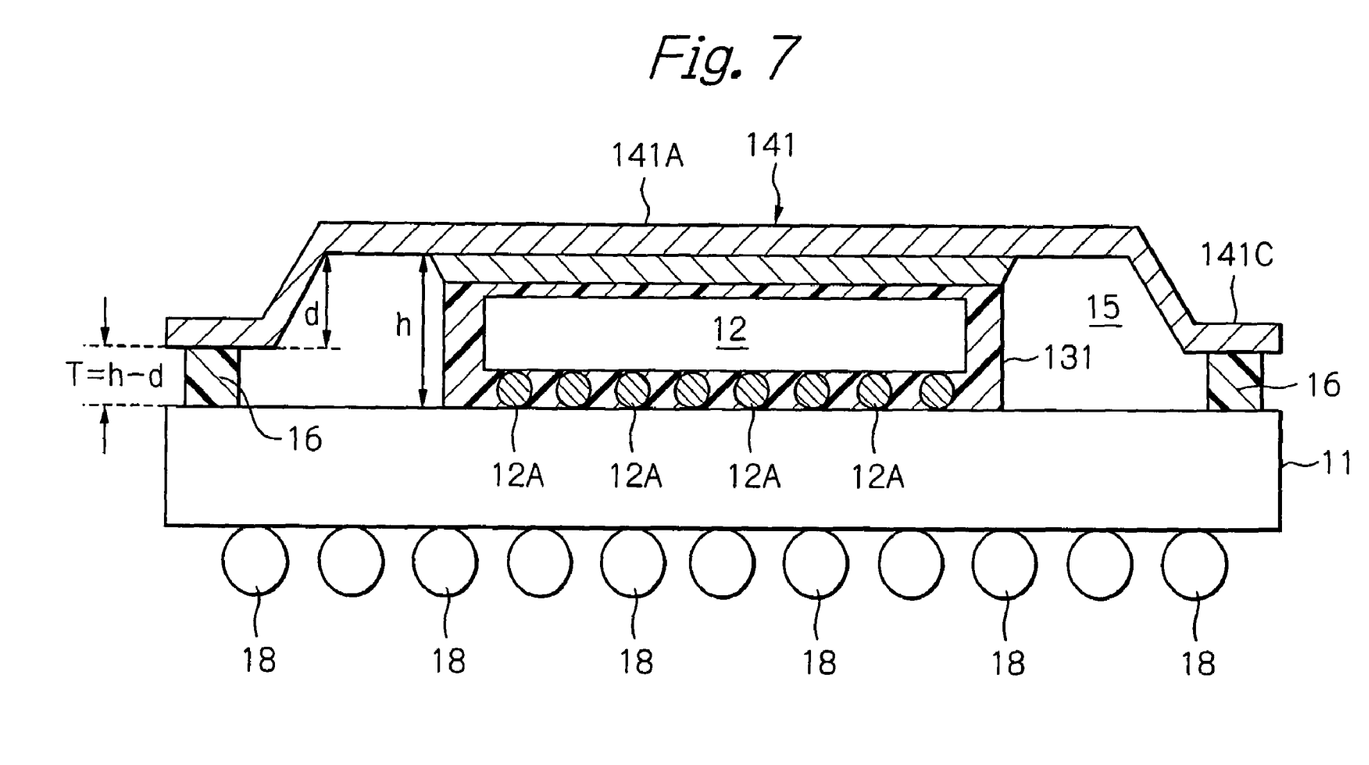
FIG. 7 is a partial cross-sectional view of a second embodiment of the BGA type semiconductor package according to the present invention.

With reference to FIG. 7 which is a partial cross-sectional view, a second embodiment of the BGA type semiconductor package according to the present invention is illustrated.

The second embodiment is substantially identical to the first embodiment of FIG. 2 except that a resin seal structure 131 is substituted for the resin seal structure 13. In particular, the resin seal structure 131 is formed as a molded resin enveloper on the top surface of the package board 11 so that the FC type semiconductor chip 12 with the metal bumps 12A is completely sealed and encapsulated in the molded resin seal enveloper 131. It is possible to carry out the formation of the molded resin seal enveloper 131 by using a resin transfer molding process. The molded resin seal structure 131 also may be made of a suitable rein material, such as silicone-based resin, epoxy-based resin or the like.

In the second embodiment, a height "h" is defined as the sum of a thickness of the molded resin seal enveloper 131 and a thickness of the adhesive layer 17.

Also, in the second embodiment using the molded resin enveloper 131 which completely encapsulates the FC type semiconductor chip 12, a non-FC type semiconductor chip may be substituted for the FC type semiconductor chip 12.

Third Embodiment

Figure 8:
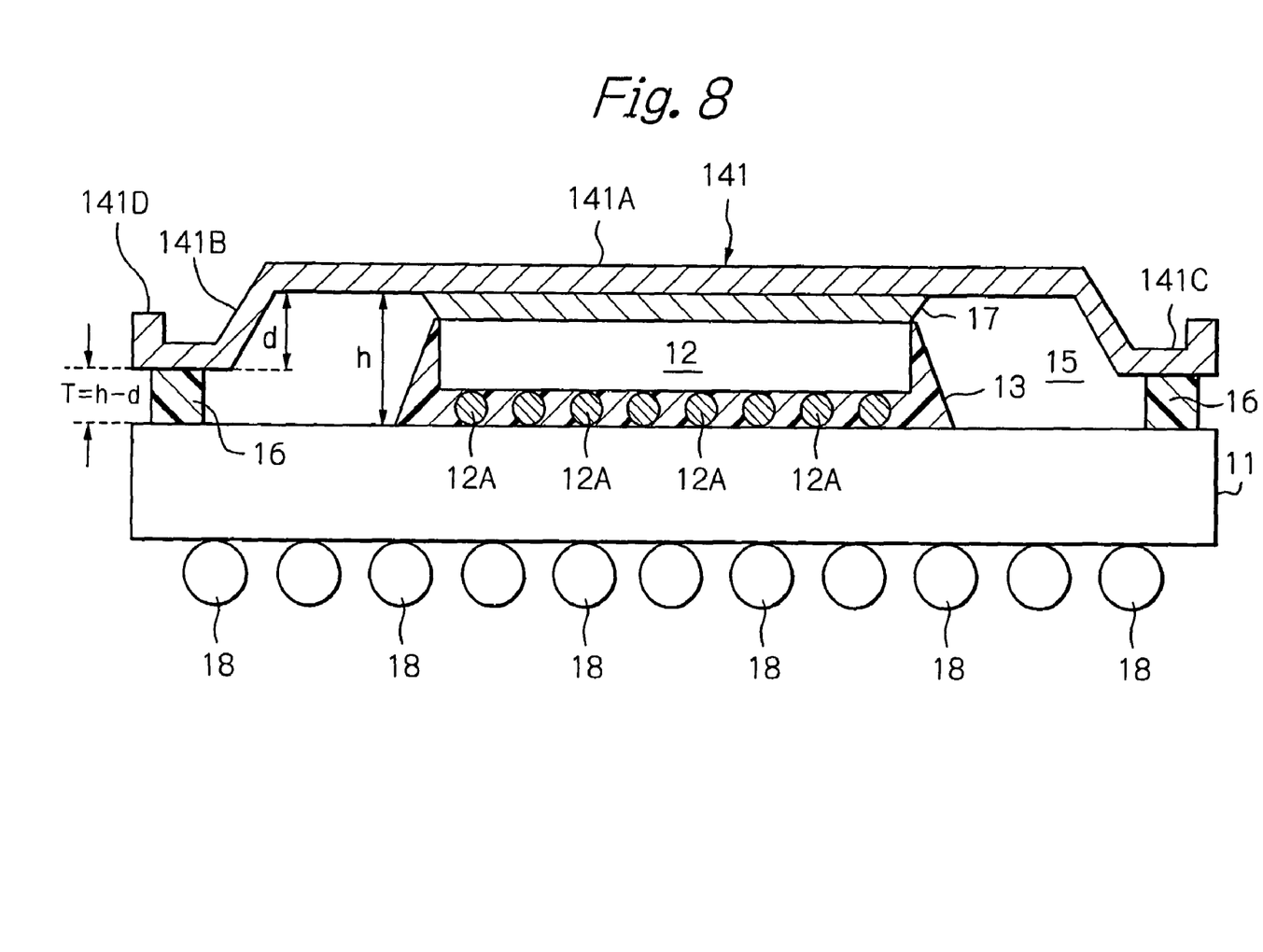
FIG. 8 is a partial cross-sectional view of a third embodiment of the BGA type semiconductor package according to the present invention.

With reference to FIG. 8 which is a partial cross-sectional view, a third embodiment of the BGA type semiconductor package according to the present invention is illustrated.

The third embodiment is substantially identical to the first embodiment of FIG. 2 except that the metal lid member 141 is additionally provided with a rim portion 141D integrally projecting from the outer peripheral edge of the flange portion 141C. Due to the additional provision of the rim portion 141D, it is possible to considerably improve a rigidity of the metal lid member 141, especially the flange portion 141C.

In the third embodiment, the skirt, flange and rim portions 141A, 141B and 141C define a peripheral portion of the metal lid member 141.

Note, the metal lid member 141 featuring the rim portion 141D may be used in the second embodiment of FIG. 7, if necessary.

Fourth Embodiment

Figure 9:
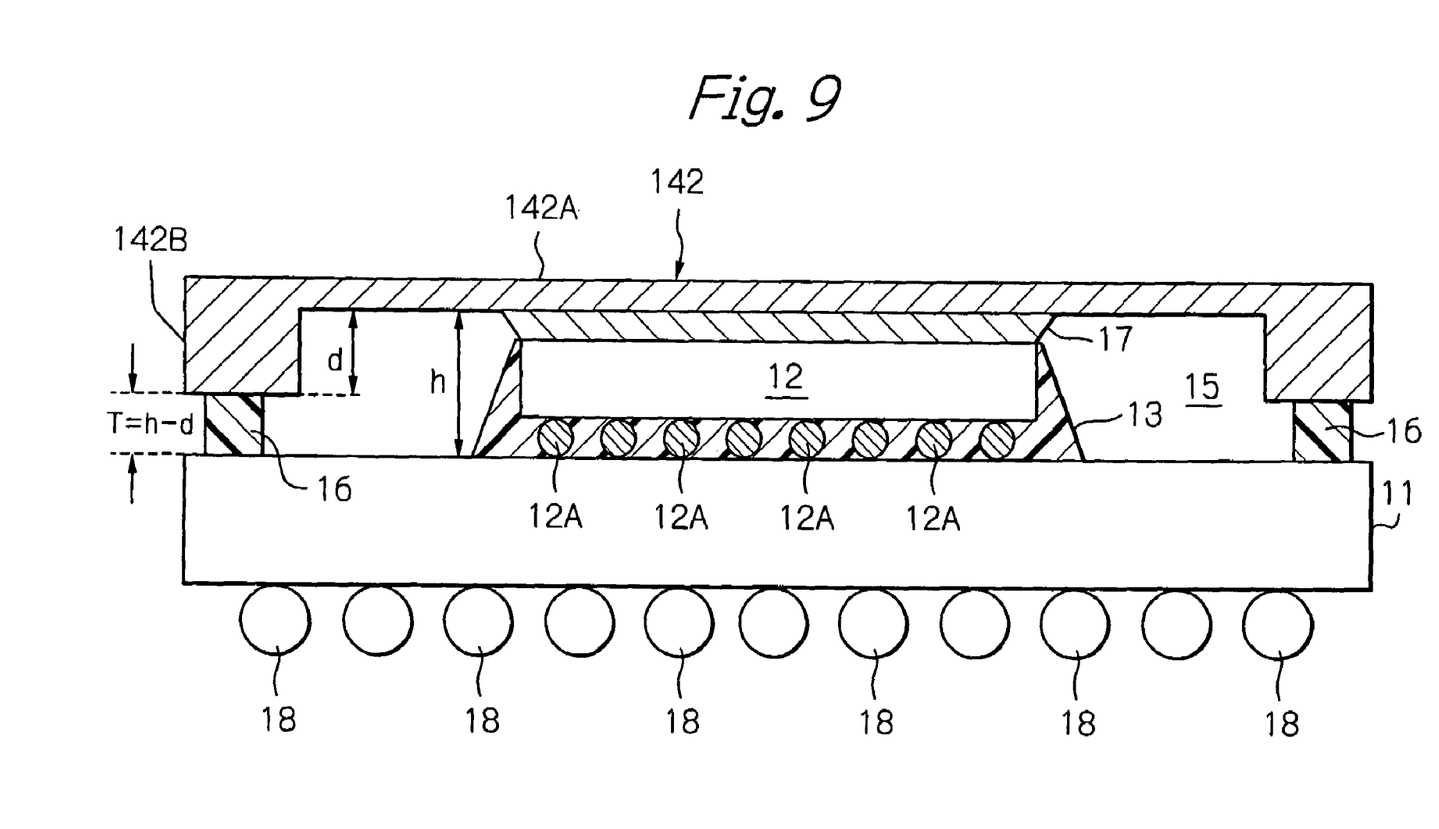
FIG. 9 is a partial cross-sectional view of a fourth embodiment of the BGA type semiconductor package according to the present invention.

With reference to FIG. 9 which is a partial cross-sectional view, a fourth embodiment of the BGA type semiconductor package according to the present invention is illustrated.

The fourth embodiment is substantially identical to the first embodiment of FIG. 2 except that a metal lid member 142 is substituted for the metal lid member 141 of FIG. 2. The metal lid member 142 includes a top central portion 142A, and a thickened flange portion 142B integrally suspended from a peripheral edge of the top central portion 142A, and the thickened flange portion 142B is adhered to the top surface of the package board 11 by the resin adhesive layer 16.

In the forth embodiment of FIG. 9, the metal lid member 142 has a recess defined by the top central portion 142A and the thickened flange 142B to accommodate the FC type semiconductor chip 12 with the paste-like adhesive layer 17.

Note, the metal lid member 142 may be used in the second embodiment of FIG. 7, if necessary.

Finally, it will be understood by those skilled in the art that the foregoing description is of preferred embodiments of the packages and methods, and that various changes and modifications may be made to the present invention without departing from the spirit and scope thereof.

The invention claimed is:

1. A semiconductor package comprising:
    a package board;
    a semiconductor chip mounted on said package board;
    a lid member defining a recess for accommodating said semiconductor chip and mounted on said package board so that said semiconductor chip is accommodated in the recess of said lid member;
    a first adhesive layer formed on said package board so that a peripheral portion of said lid member is adhered on said package board with said first adhesive layer; and
    a second adhesive layer formed on said semiconductor chip so that a central portion of said lid member is adhered to said semiconductor chip with said second adhesive layer,
    wherein the following relationship is established:

$$25 \mu m \leq h-d \leq 300 \mu m$$

where: "d" is a depth of the recess of said lid member; and "h" is a sum of a thickness of said semiconductor chip and a thickness of said second adhesive layer.

2. The semiconductor package as set forth in claim 1, wherein said first adhesive layer is made of a resin-based adhesive which exhibits an elasticity coefficient falling within a range from 1 MPa to 3 GPa.

3. The semiconductor package as set forth in claim 1, wherein said first adhesive layer is made of a resin-based adhesive which exhibits an elasticity coefficient falling within a range from 1 MPa to 3 GPa in a temperature range from 0 to 125° C.

4. The semiconductor package as set forth in claim 1, wherein said semiconductor chip is formed as a flip-chip type semiconductor chip having a plurality of metal bumps bonded on a top surface thereof, the mounting of said flip-chip type semiconductor chip being carried out such that the metal bumps are bonded on said package board so as to establish electrical connection therebetween.

5. The semiconductor package as set forth in claim 4, further comprising a resin seal structure formed to seal said metal bumps between said package board and said flip-chip type semiconductor chip.

6. The semiconductor package as set forth in claim 1, wherein said lid member is formed as a shaped copper plate by a draw forming process.

7. The semiconductor package as set forth in claim 1, wherein the peripheral portion of said lid member includes a skirt portion suspended from a peripheral edge of said central portion, and a flange portion extending from said skirt portion.

8. The semiconductor package as set forth in claim 7, wherein the peripheral portion of said lid member further includes a rim portion projecting from an outer peripheral edge of said flange portion.

9. The semiconductor package as set forth in claim 1, wherein the peripheral portion of said lid member is formed as a thickened flange portion suspended from a peripheral edge of said central portion.

10. The semiconductor package as set forth in claim 1, wherein said first adhesive layer is made of a resin-based adhesive selected from the group consisting of a silicone-based adhesive, and an epoxy-based adhesive.

11. The semiconductor package as set forth in claim 1, wherein said second adhesive layer is made of a resin-based adhesive selected from the group consisting of a silicone-based adhesive, and an epoxy-based adhesive.

12. The semiconductor package as set forth in claim 1, wherein said second adhesive layer is made of a silver paste.

13. A semiconductor package comprising:
    a package board;
    a semiconductor chip mounted on said package board;
    a molded resin enveloper sealing and encapsulating said semiconductor chip;
    a lid member defining a recess for accommodating said molded resin enveloper and mounted on said package board so that said molded resin enveloper is accommodated in the recess of said lid member;
    a first adhesive layer formed on said package board so that a peripheral portion of said lid member is adhered on said package board with said first adhesive layer; and
    a second adhesive layer formed on said molded resin enveloper so that a central portion of said lid member is adhered to said molded resin enveloper with said second adhesive layer,
    wherein the following relationship is established:

$$25 \mu m \leq h-d \leq 300 \mu m$$

Herein: "d" is a depth of the recess of said lid member; and "h" is a sum of a thickness of said molded resin enveloper and a thickness of said second adhesive layer.

14. The semiconductor package as set forth in claim 13, wherein said first adhesive layer is made of a resin-based adhesive which exhibits an elasticity coefficient falling within a range from 1 MPa to 3 GPa.

15. The semiconductor package as set forth in claim 13, wherein said first adhesive layer is made of a resin-based adhesive which exhibits an elasticity coefficient falling within a range from 1 MPa to 3 GPa in a temperature range from 0 to 125° C.

16. The semiconductor package as set forth in claim 13, wherein said lid member is formed as a shaped copper plate by a draw forming process.

17. The semiconductor package as set forth in claim 13, wherein the peripheral portion of said lid member includes a skirt portion suspended from a peripheral edge of said central portion, and a flange portion extending from said skirt portion.

18. The semiconductor package as set forth in claim 17, wherein the peripheral portion of said lid member further includes a rim portion projecting from an outer peripheral edge of said flange portion.

19. The semiconductor package as set forth in claim 13, wherein the peripheral portion of said lid member is formed as a thickened flange portion suspended from a peripheral edge of said central portion.

* * * * *